US009385893B2

(12) United States Patent
Palusa et al.

(10) Patent No.: US 9,385,893 B2
(45) Date of Patent: Jul. 5, 2016

(54) MODULAR LOW POWER SERIALIZER-DESERIALIZER

(71) Applicant: LSI Corporation, San Jose, CA (US)

(72) Inventors: Chaitanya Palusa, Fremont, CA (US); Tomasz Prokop, Pleasanton, CA (US); Hiep T. Pham, San Jose, CA (US); Volodymyr Shvydun, Los Altos, CA (US); Adam B. Healey, Newburyport, MA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 104 days.

(21) Appl. No.: 14/176,728

(22) Filed: Feb. 10, 2014

(65) Prior Publication Data

US 2015/0207648 A1     Jul. 23, 2015

Related U.S. Application Data

(60) Provisional application No. 61/930,525, filed on Jan. 23, 2014.

(51) Int. Cl.
| H04B 1/38 | (2015.01) |
| H04L 5/16 | (2006.01) |
| H04L 27/10 | (2006.01) |
| H04L 27/18 | (2006.01) |
| H04L 25/03 | (2006.01) |
| H04L 7/00 | (2006.01) |
| H04L 27/00 | (2006.01) |
| H04L 7/02 | (2006.01) |
| H03M 1/12 | (2006.01) |
| H03M 1/38 | (2006.01) |

(52) U.S. Cl.
CPC ........ *H04L 25/03057* (2013.01); *H04L 7/0087* (2013.01); *H04L 7/02* (2013.01); *H04L 25/03* (2013.01); *H04L 27/0002* (2013.01); *H03M 1/1215* (2013.01); *H03M 1/38* (2013.01)

(58) Field of Classification Search
CPC ............ H04L 25/03057; H04L 7/0087; H04L 27/0002
USPC ....................................................... 375/233
See application file for complete search history.

(56) References Cited

U.S. PATENT DOCUMENTS

| 6,055,269 A * | 4/2000 | Drost et al. .................. 375/232 |
| 8,160,179 B2 | 4/2012 | Forey |
| 8,265,134 B2 | 9/2012 | Agazzi et al. |
| 8,467,440 B2 * | 6/2013 | Aziz et al. .................... 375/233 |

(Continued)

OTHER PUBLICATIONS

Texas Instruments; "Generating Precision Clocks for Time—Interleaved ADCs ;" Literature No. SNAA124, 2011.*

(Continued)

*Primary Examiner* — Nader Bolourchi

(57) ABSTRACT

Modular, low power serializer-deserializer receivers and methods for configuring such receivers are disclosed. The disclosed receivers are configured to sample input signals at the front-end utilizing a plurality of track-and-hold circuits time-interleaved based on a plurality of phase-shifted clock signals. The disclosed receivers are also modular and various processing components, including analog front-end and equalizers, are selectively utilized based on the determined length of the communication channel, ranging from ultra short reach applications to very short reach, medium reach, long reach and extra long reach applications.

18 Claims, 9 Drawing Sheets

(56) References Cited

U.S. PATENT DOCUMENTS

| | | |
|---|---|---|
| 8,483,579 B2 | 7/2013 | Fukuda |
| 8,487,795 B1* | 7/2013 | Jiang et al. .................. 341/122 |
| 2008/0192859 A1* | 8/2008 | Foley ........................... 375/296 |
| 2010/0054760 A1* | 3/2010 | Fukuda ......................... 398/202 |
| 2015/0130513 A1* | 5/2015 | Landolt .......................... 327/94 |

OTHER PUBLICATIONS

Tao Jiang; "Design Techniques for Low-Power Multi-GS/s Analog-to-Digital Converters." Doctoral Thesis, Oregon State University, Jun. 10, 2013.*

William C. Black et al., Time Interleaved Converter Arrays, IEEE Journal of Solid-State Circuits, vol. SC-15, No. 6, Dec. 1980, pp. 1022-1029.

Baiying Yu et al., Error analysis for time-interleaved Analog Channels, 2001 IEEE International Symposium on Circuits and Systems, vol. 1, pp. 468-471, 2001.

Erwin Janssen et al., An 11b 3.6GS/s Time-Interleaned SAR ADC in 65nm CMOS, ISSCC 2013, Session 26, High-Speed Data Converters, 26.2, 2013 IEEE International Solid-State Circuits Conference, Feb. 20, 2013, pp. 464-466.

Brian Setterberg et al., A 14b 2.5GS/s 8-Way-Interleaved Pipelined ADC with Background Calibration and Digital Dynamic Linearity Correction, ISSC 2013, Session 26, High-Speed Data Converters, 26.3, 2013 IEEE International Solid-State Circuits Conference, Feb. 20, 2013, pp. 466-468.

Afshin Haftbaradaran et al., Mismatch Compensation Techniques Using Random Data for Time-Interleaved A/D Converters, ISCAS 2006, ©2006 IEEE, pp. 3402-3405.

* cited by examiner

MODULAR LOW POWER SERIALIZER-DESERIALIZER

CROSS-REFERENCE TO RELATED APPLICATIONS

The present application claims the benefit under 35 U.S.C. §119(e) of U.S. Provisional Application Ser. No. 61/930,525, filed Jan. 23, 2014. Said U.S. Provisional Application Ser. No. 61/930,525 is hereby incorporated by reference in its entirety.

TECHNICAL FIELD

The present invention relates to the field of communication systems and particularly to low power serializer-deserializers.

BACKGROUND

A serializer-deserializer (SerDes) is a pair of functional blocks commonly used in high speed communications to compensate for limited input/output. These blocks convert data between serial data and parallel interfaces in each direction. The term SerDes generically refers to interfaces used in various technologies and applications.

SUMMARY

Accordingly, an embodiment of the present disclosure is directed to a receiver. The receiver includes a clock generator configured for generating a plurality of phase-shifted clock signals. The receiver also includes a plurality of time-interleaved track-and-hold circuits configured for sampling an analog input signal with the plurality of phase-shifted clock signals. Each one of the plurality of time-interleaved track-and-hold circuits is configured for tracking and holding a value corresponding to one of the plurality of phase-shifted clock signals.

A further embodiment of the present disclosure is directed to a method for processing an analog input signal at a receiver. The method includes: generating a plurality of phase-shifted clock signals; and sampling the analog input signal utilizing a plurality of track-and-hold circuits time-interleaved based on the plurality of phase-shifted clock signals, wherein each one of the plurality of track-and-hold circuits is configured for tracking and holding a value corresponding to one of the plurality of phase-shifted clock signals.

An additional embodiment of the present disclosure is directed to a method for configuring a modular receiver for a particular communication channel. The method includes: providing a clock generator configured for generating a plurality of phase-shifted clock signals; providing a plurality of time-interleaved track-and-hold circuits configured for sampling an analog input signal with the plurality of phase-shifted clock signals, wherein each one of the plurality of time-interleaved track-and-hold circuits is configured for tracking and holding a value corresponding to one of the plurality of phase-shifted clock signals; and determining a length of the communication channel, the length being one of: an ultra short reach, a very short reach, a medium reach, a long reach and an extra long reach. Additional modular components can be provided based on the determined length of the communication channel. For instance, if the length of the communication channel is one of: a very short reach, a medium reach, a long reach and an extra long reach, an analog front-end is provided for conditioning the analog input signal prior to providing the analog input signal to the plurality of time-interleaved track-and-hold circuits. In addition, if the length of the communication channel is one of: a medium reach and a long reach, a decision feed forward equalizer for equalizing signals received from the plurality of time-interleaved track-and-hold circuits is provided. Furthermore, if the length of the communication channel is a long reach, a decision feedback equalizer is provided for equalizing signals received from the plurality of time-interleaved track-and-hold circuits prior to the decision feed forward equalizer.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

A traditional SerDes receiver data path normally includes an analog front-end of a Variable Gain Amplifier (VGA) and a Continuous-Time Linear Equalizer (CTLE), followed by a Decision Feedback Equalizer (DFE) supported by digital adaptation circuits. This traditional architecture reaches the speed and power limits at around 28-32 gigabits per second (Gbps), and it is not possible to simply scale a traditional architecture to 56+ Gbps because either the elementary, transistor level circuits would be too slow or the power consumed would be prohibitively high. Even at 28 Gbps, the power consumed by a traditional architecture is too high for many customer applications. To approach data rates of 56 Gbps or higher with acceptable power consumption, a new SerDes receiver architecture is required.

Embodiments of the present disclosure are directed to modular, low power SerDes receivers capable of processing data rates of 56 Gbps and higher, and at the same time, offering a much reduced (>50%) power consumption in comparison to traditional architectures currently in use. More specifically, the low power SerDes receivers are configured to utilize time-interleaved Track and Hold (T/H) front-end components that enable several efficient equalization solutions (such as a pipelined DFE, analog Digital Feed Forward Equalizer or pre-cursor ISI correction). Time-interleaved T/H front-end also allows for low frequency and low power clock distribution. As a result, the SerDes receivers in accordance with embodiments of the present disclosure can achieve industry leading power consumption for this class of receivers across all channels types or lengths, ranging from ultra short reach applications to extra long reach applications.

Figure 1:
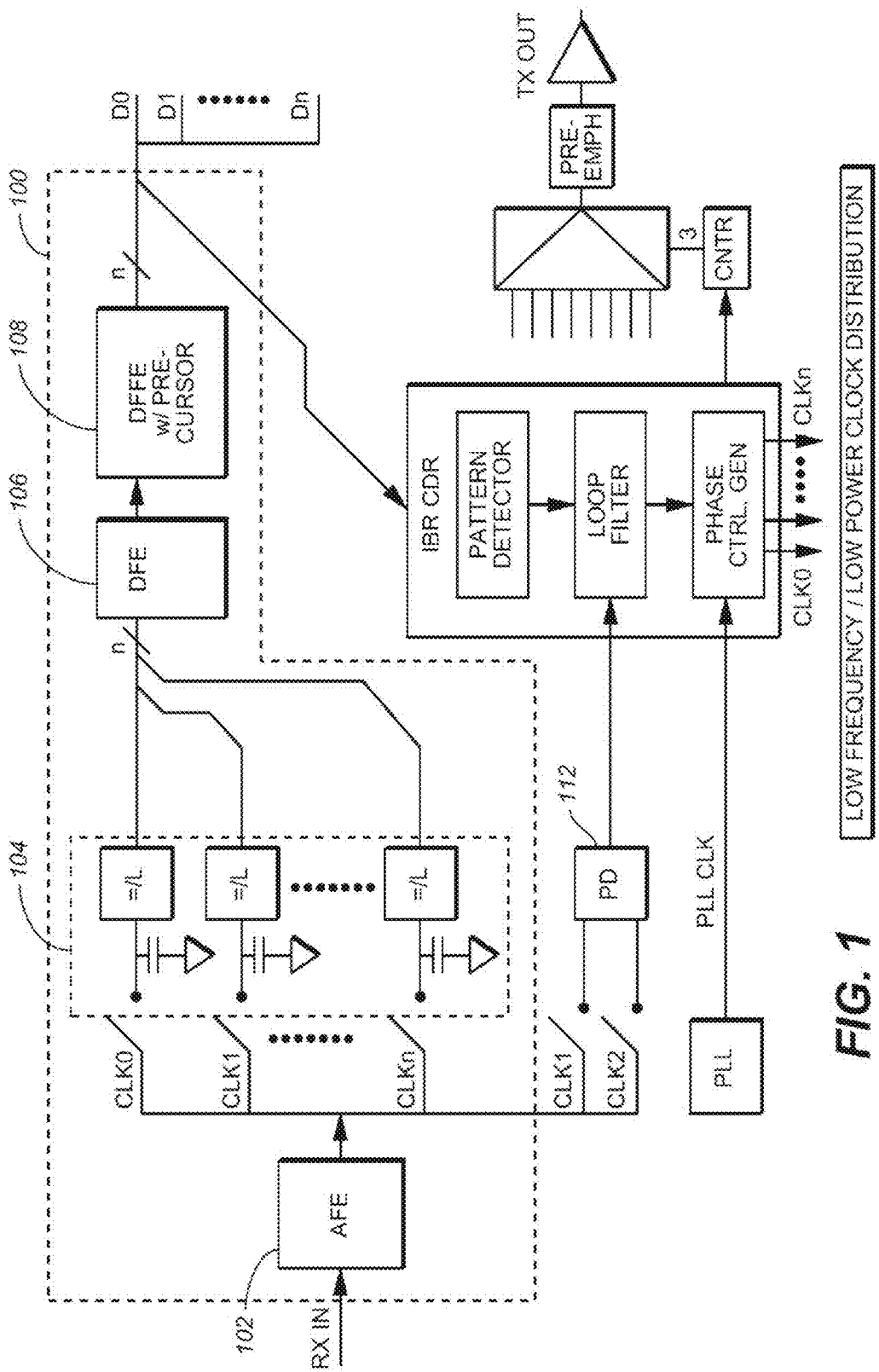
FIG. 1 is a block diagram depicting an embodiment of an n-way interleaved SerDes receiver.

Referring to FIG. 1, a generalized block diagram of a full n-way interleaved SerDes receiver data path 100 in accordance with an exemplary embodiment of the present disclosure is shown. In this exemplary embodiment, the receiver data path includes an analog front-end (AFE) 102, a block of n-way time-interleaved Track-and-Track-and-Hold (T/Hs) 104 and two optional equalization components: a Decision Feedback Equalizer (DFE) 106 and a Decision Feed Forward Equalizer (DFFE) with pre-cursor compensation 108. As will be described later, the equalization are said to be optional because depending on the application, all, some or none of the equalization components may be needed.

Figure 2:
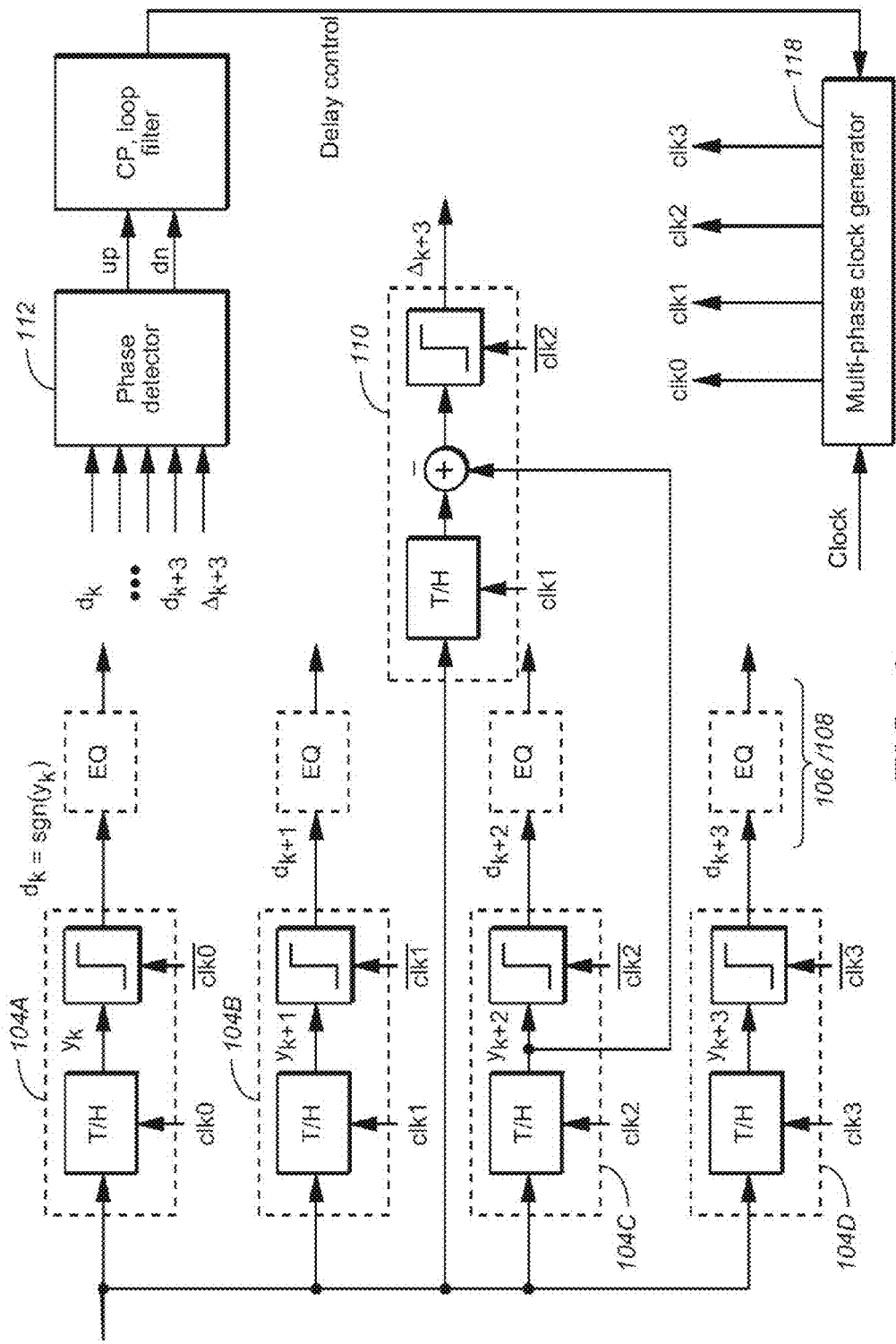
FIG. 2 is a schematic depicting the SerDes receiver of FIG. 1, wherein n=4.

FIG. 2 is a schematic depicting the interleaved SerDes receiver as shown in FIG. 1. For illustrative purposes, the schematic shown in FIG. 2 depicts a simplified 4-way time-interleaved Track-and-Hold (T/Hs) configuration. This simplified exemplary receiver includes 4 front-end Track and Hold (T/H) circuits 104A through 104D, each followed by a data slicer and optional equalizers 106 and/or 108. In this example, the clock signals clk0-clk3 provided to the time-interleaved T/Hs are of ¼ data rate, shifted by 1 T, where 1 T is time of one bit in the transmission channel $$\left(\text{i.e., } \frac{1}{\text{data rate}}\right).$$

This configuration allows the frequency of the distributed clock to be reduced by the interleaving factor for power optimization at very high data rates, providing a low frequency low power SerDes receiver.

It is noted that in addition to the 4 front-end Track and Hold (T/H) circuits 104A through 104D, a $5^{th}$ T/H 110 is also depicted in FIG. 2, with a summer on the output used for calculating delta values used in the phase detector (PD) 112 depicted in both FIGS. 1 and 2. It is contemplated that only one such additional T/H 110 is needed to support the phase detector for timing recovery, regardless of the interleaving factor of the front end. Furthermore, it is noted that the phase detector 112 is a part of the baud rate timing recovery (depicted in FIG. 1 as the Clock and Data Recovery, or the CDR block, which is outside of the interleaved SerDes receiver data path 100) that controls the multi-phase clock generator 118, and the specific implementation of the phase detector 112 and the CDR block may vary without departing from the spirit and scope of the present disclosure.

It is also understood that the 4-way time-interleaved T/H configuration depicted in FIG. 2 is merely exemplary, and SerDes receivers in accordance with embodiments of the present disclosure can be n-way (n>1) interleaved in the similar manner as depicted in the figures. In addition, the clock signals provided to the phase detector 112 as shown in FIGS. 1 and 2 are also exemplary. It is contemplated that at least one, but as many as required number of clock signals can be provided to the phase detector 112 without departing from the spirit and scope of the present disclosure.

Figure 3:
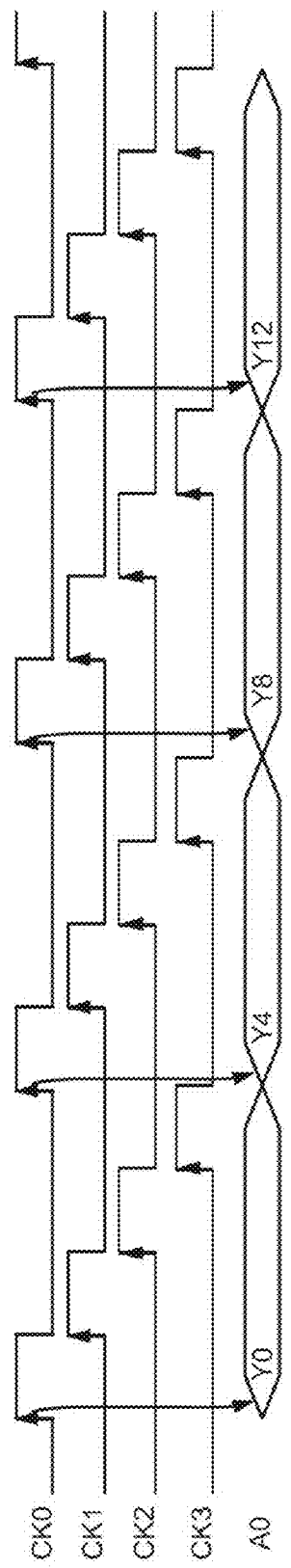
FIG. 3 is a timing diagram illustrating input signal interleaving in the SerDes receiver depicted in FIG. 2.

Referring now to FIG. 3, a timing diagram illustrating the 4-way interleaved receiver depicted in FIG. 2 is shown. As a result of interleaving the front-end, the staggered clock allows each signal (e.g., Y0, Y4, Y8 and Y12) to be held for 4 units of time (n units of time for n-way interleaving), providing more time for each signal to be processed. This in turn allows lower power and lower clock frequency to be used, making the SerDes receiver capable of processing high data rates (e.g., 56 Gbps and higher) at a reduced power consumption in comparison to traditional architectures currently in use. Furthermore, interleaving results in parallelization of processing naturally supports pre-cursor compensation. In turn, pre-cursor compensation allows for a better performing baud-rate CDR due to symmetrical ISI cancellation with respect to the cursor. It results with better "eye" margins thus minimizes the need for skew adjustments to the sampling clocks.

An additional advantage of the SerDes receivers in accordance with embodiments of the present disclosure is that the various components of the SerDes receiver are configured to be modular. That is, SerDes receivers in accordance with embodiments of the present disclosure offer modular scalability for a full range of applications with efficient, scaling power characteristic. Exemplary configurations of data path processing are as follows, as illustrated in FIGS. 4 through 8.

Figure 4:
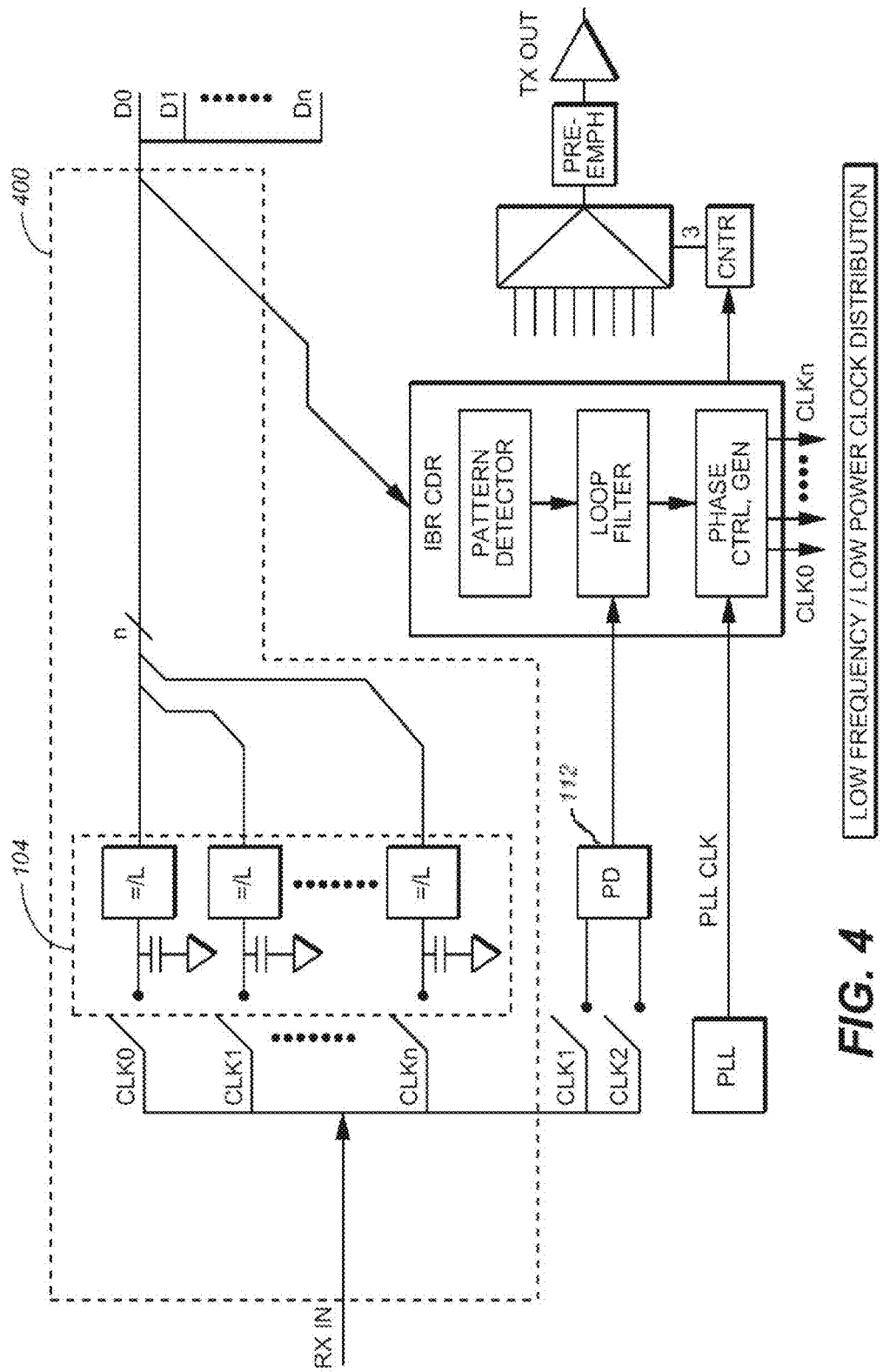
FIG. 4 is a block diagram depicting an embodiment of an n-way interleaved SerDes receiver for ultra short reach (USR) applications.

As shown in FIG. 4, a SerDes receiver data path 400 in accordance with one embodiment of the present disclosure is shown. Such a receiver data path 400 utilizes the same n-way time-interleaved T/H block 104 as depicted in FIG. 1, but is not equipped with the analog front-end and the equalization components. It is contemplated that such a SerDes receiver data path 400 is particularly useful for Ultra Short Reach (USR) applications.

Figure 5:
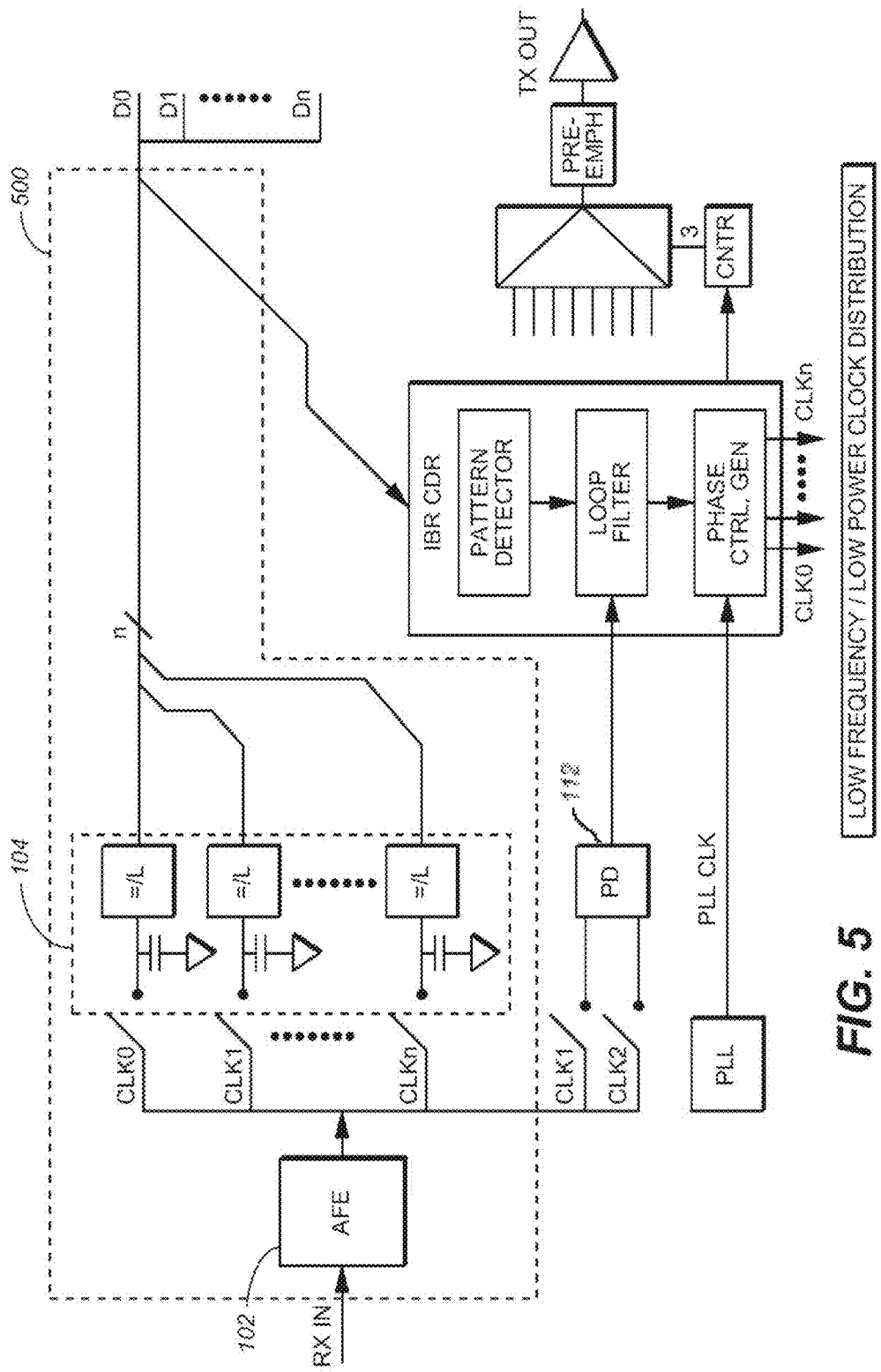
FIG. 5 is a block diagram depicting an embodiment of an n-way interleaved SerDes receiver for very short reach (VSR) applications.

As shown in FIG. 5, a SerDes receiver data path 500 in accordance with an alternative embodiment of the present disclosure is shown. Such a receiver data path 500 utilizes all the components of the receiver data path 400, with the addition of the analog front-end 102. It is contemplated that such a SerDes receiver data path 500 is particularly useful for Very Short Reach (VSR) applications.

Figure 6:
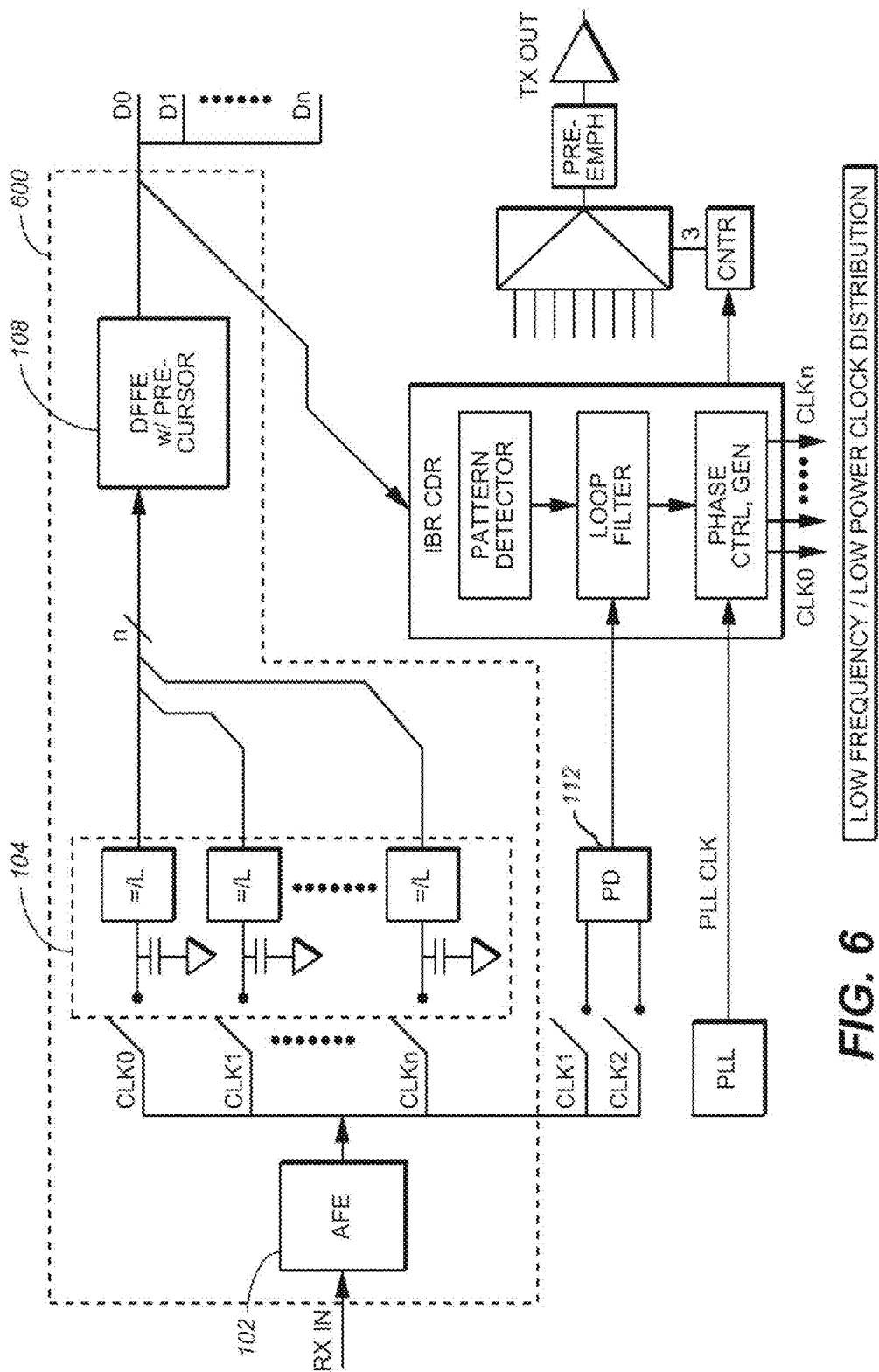
FIG. 6 is a block diagram depicting an embodiment of an n-way interleaved SerDes receiver for medium reach (MR) applications.

As shown in FIG. 6, a SerDes receiver data path 600 in accordance with an alternative embodiment of the present disclosure is shown. Such a receiver data path 600 utilizes all the components of the receiver data path 500, with the addition of the Decision Feed Forward Equalizer (DFFE) with pre-cursor compensation 108. It is contemplated that such a SerDes receiver data path 600 is particularly useful for Medium Reach (MR) applications.

Figure 7:
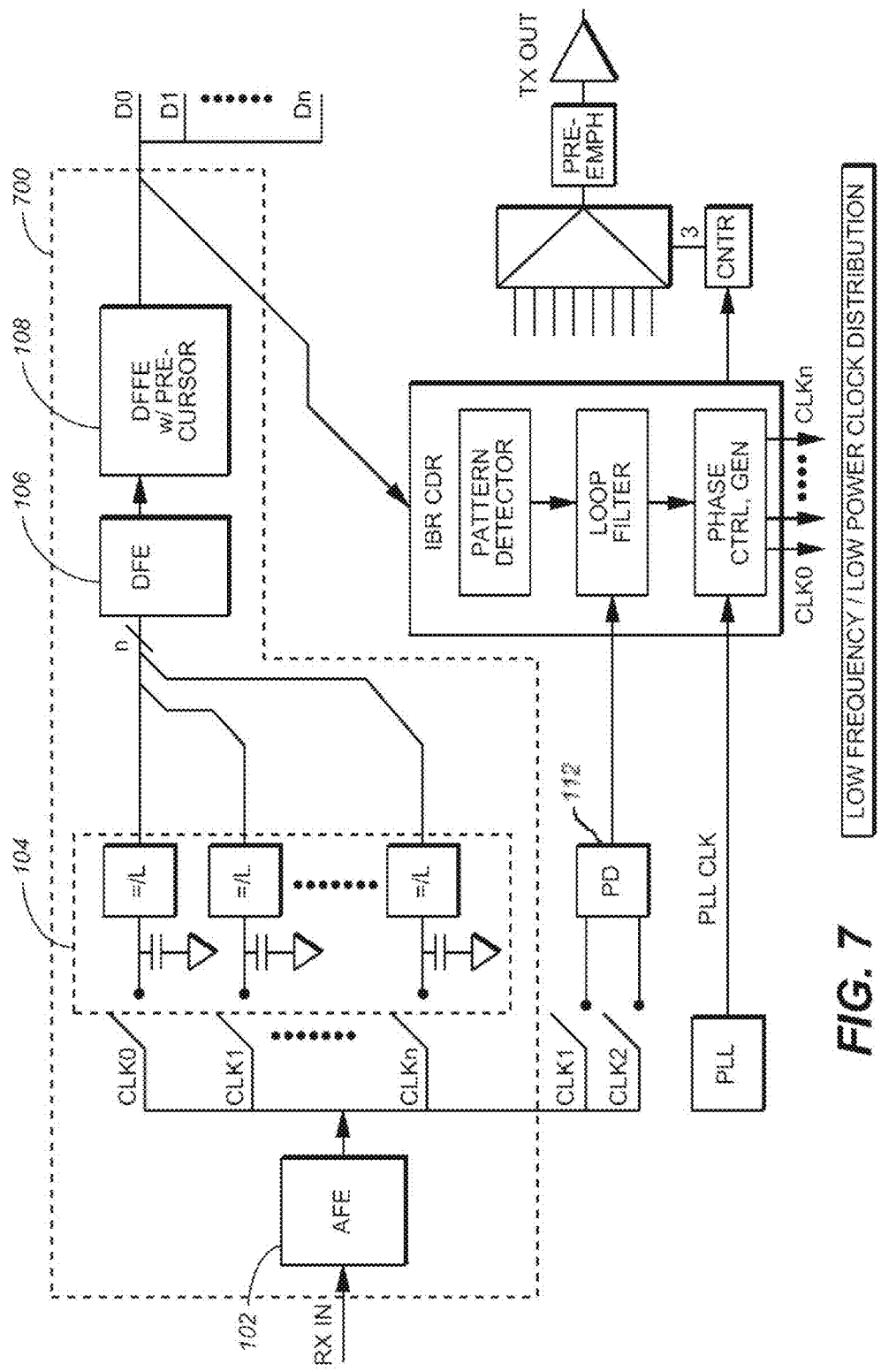
FIG. 7 is a block diagram depicting an embodiment of an n-way interleaved SerDes receiver for long reach (LR) applications.

As shown in FIG. 7, a SerDes receiver data path 700 in accordance with an alternative embodiment of the present disclosure is shown. Such a receiver 700 utilizes all the components of the receiver data path 600, with the addition of the Decision Feedback Equalizer (DFE) 106. It is contemplated that such a SerDes receiver data path 700 is particularly useful for Long Reach (LR) applications.

Figure 8:
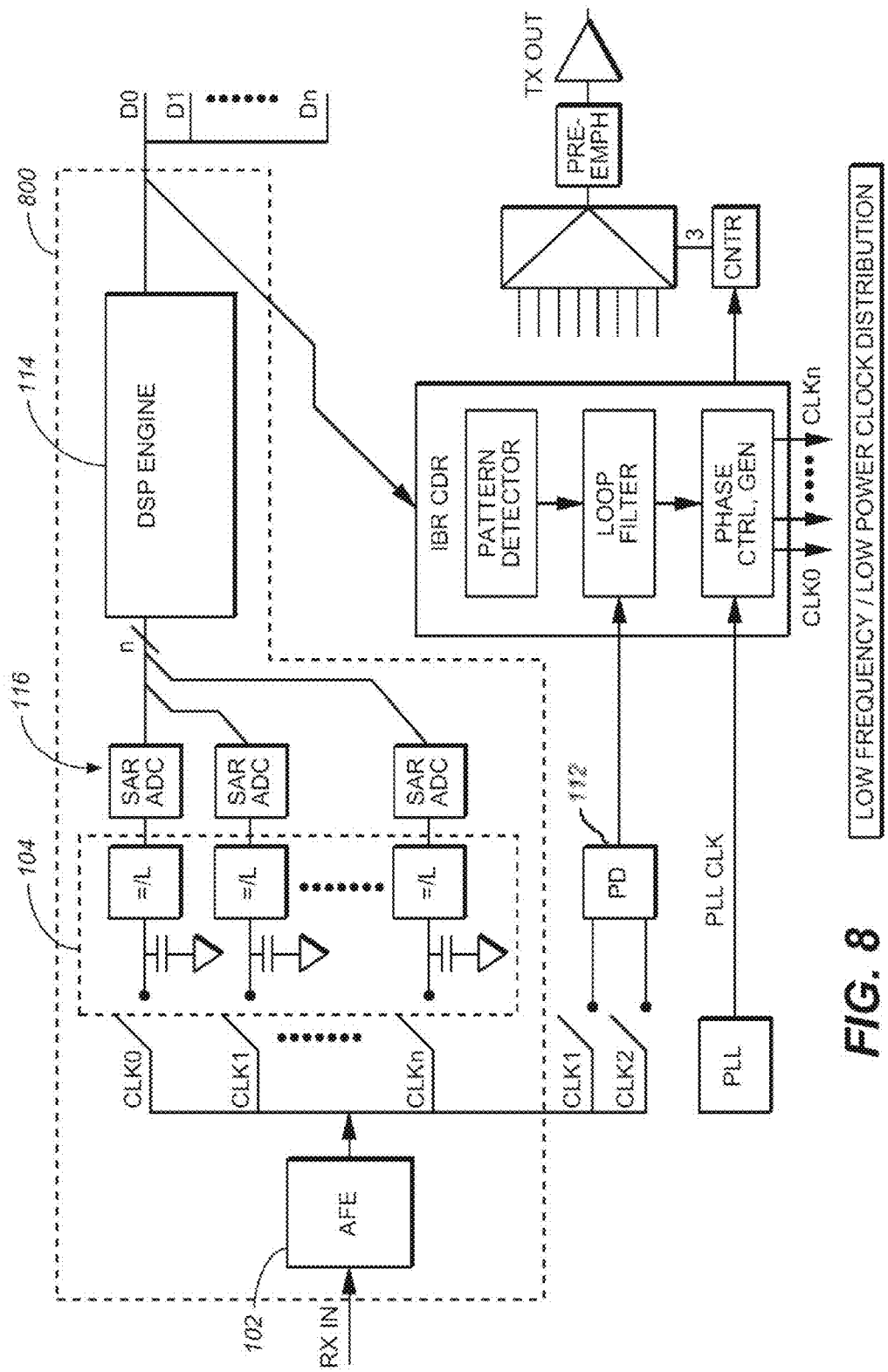
FIG. 8 is a block diagram depicting an embodiment of an n-way interleaved SerDes receiver for extra long reach (XLR) applications.

As shown in FIG. 8, a SerDes receiver data path 800 in accordance with an alternative embodiment of the present disclosure is shown. SerDes receiver data path 800 is configured to utilize a Digital Signal Processing (DSP) engine 114 to process signals for Extra Long Reach (XLR) applications. As depicted in the figure, n Analog-to-Digital Converters (ADCs) 116 are utilized to convert the output of the n-way time-interleaved T/H block 104 to digital signals to be processed by the DSP engine 114. In a particular implementation, the ADCs utilized are Successive Approximation Register (SAR) ADCs. However, it is contemplated that other ADCs may also be utilized without departing from the spirit and scope of the present disclosure.

The various embodiments described above depict a modular SerDes architecture that is capable of processing 56+ Gbps data rates in a power-efficient manner. The interleaved front end lowers the frequency/power of the distributed clocks, and naturally facilitates design-efficient data path equalization methods by relaxing loading/timing requirements of the front end T/H. It is contemplated that predominantly Complementary Metal-Oxide-Semiconductor Transistor (CMOS) circuits may be utilized to further improve the power efficiency.

It is also contemplated that the various modular components (i.e., the analog front-end 102, the DFE 106 and the DFFE 108) can be configured as bypassable components on the SerDes receiver circuitry, wherein they can be individually and dynamically enabled/disabled. Alternatively, a pre-configured SerDes receiver can be designed for a particular application (ranging from USR to XLR), and based on requirements of that particular application, certain modular components may not need to be included in the SerDes receiver circuitry at all. It is understood that whether to include a specific modular component may vary based on specific application requirements (e.g., based on the length of the communication channel ranging from ultra short, very short, medium, long and extra long) and the SerDes receiver circuitry may vary from the examples above without departing from the spirit and scope of the present disclosure.

Figure 9:
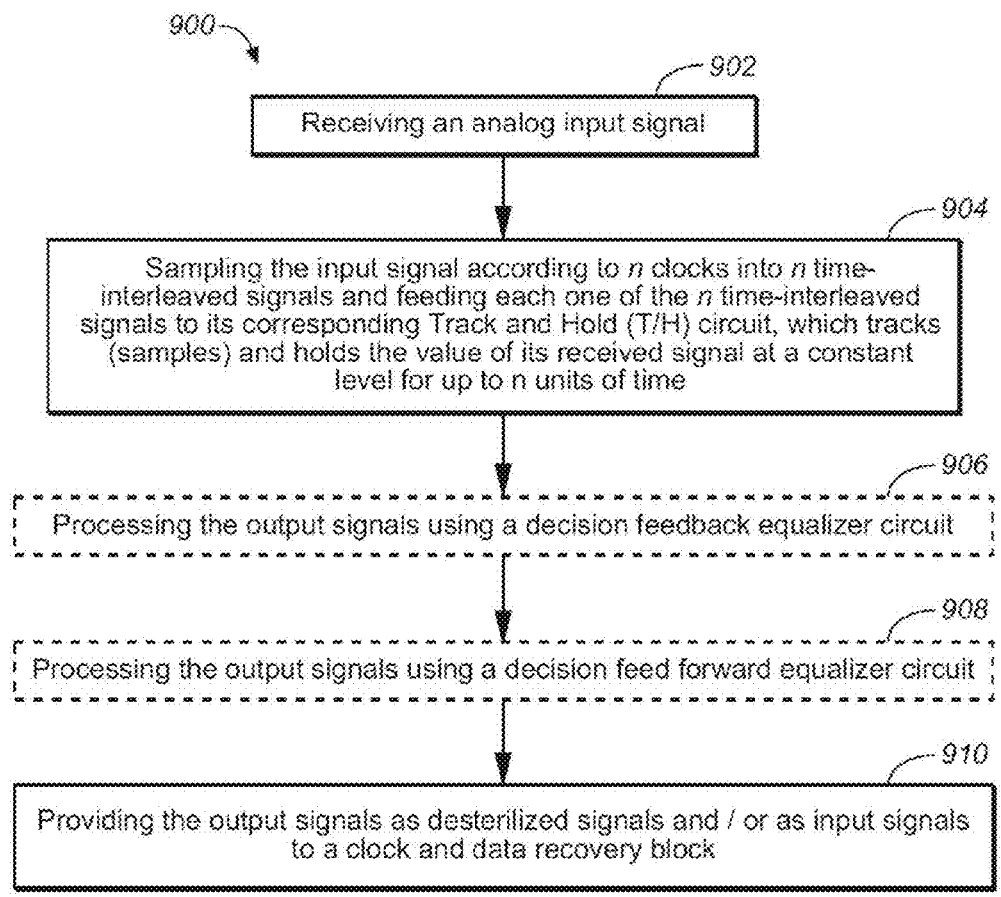
FIG. 9 is a flow diagram illustrating a method for processing an analog input signal at an n-way interleaved SerDes receiver.

Referring to FIG. 9, a method 900 for processing an analog input signal at a SerDes receiver is shown. As previously described, an analog front-end can be utilized to condition the analog input signal. Upon receiving the analog input signal in step 902, the input signal is sampled according to n clock signals into n time-interleaved signals in step 904. Interleaving is achieved by sampling the sample input with clocks of different phases. In one embodiment, the clock signals are of $$\frac{1}{n}$$

data rate, shifted by 1 T, where 1 T is time of one bit in the transmission channel $$\left(\text{i.e.,} \frac{1}{\text{data rate}}\right).$$

Each one or the n time-interleaved signals is then fed to a corresponding Track and Hold (T/H) circuit, which tracks (samples) and holds the value of its received signal at a constant level for up to n units of time. The n output signals from the T/H circuits can then be provided for further processing.

As described above, processing the analog input signal at the SerDes receiver in this manner enables several efficient equalization solutions (e.g., DFEs, DFFEs, pre-cursor ISI correction or the like) to be utilized. For instance, in one embodiment, the output signals from the T/H circuits are further processed by a DFE circuit in step 906. In another embodiment, the output signals from the T/H circuits are processed by the DFE circuit in step 906 and further processed by a DFFE circuit with pre-cursor compensation in step 908. The output signals from the last respective equalizer in the data path can then be used as desterilized signals and/or provided as input signals to a CDR block, as indicated in step 910.

It is noted that the method 900 for processing an analog input signal at a SerDes receiver is configured to be modular. That is, various processing steps can be added, removed or selectively engaged based on the requirements of a specific application. Therefore, this processing method offers modular scalability for a full range of applications with efficient, scaling power characteristic, for applications with channel length/loss ranging from ultra short reach, through very short reach, medium reach, long reach, to extra long reach.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A receiver, comprising:
  a plurality of time-interleaved track-and-hold circuits configured for sampling an analog input signal based on a plurality of phase-shifted clock signals to generate a plurality of output signals, wherein the plurality of phase-shifted clock signals are staggered, wherein each one of the plurality of time-interleaved track-and-hold circuits is configured for tracking a value corresponding to one of the plurality of phase-shifted clock signals and holding the value for a number of time units determined at least partially based on an interleaving factor of the plurality of time-interleaved track-and-hold circuits, and wherein the interleaving factor is the number of circuits of the plurality of time-interleaved track-and-hold circuits; and
  an additional track-and-hold circuit containing a summer on an output of the additional track-and-hold circuit, wherein the additional track-and-hold circuit is configured to generate an additional output signal, and wherein the plurality of output signals and the additional output signal are provided as input signals to a clock and data recovery block.

2. The receiver of claim 1, further comprising:
  an analog front-end, the analog front-end configured for conditioning the analog input signal prior to providing the analog input signal to the plurality of time-interleaved track-and-hold circuits.

3. The receiver of claim 2, further comprising:
  a decision feedback equalizer, the decision feedback equalizer configured for equalizing signals received from the plurality of time-interleaved track-and-hold circuits.

4. The receiver of claim 2, further comprising:
a decision feed forward equalizer, the decision feed forward equalizer configured for equalizing signals received from the plurality of time-interleaved track-and-hold circuits.

5. The receiver of claim 1, wherein the clock and data recovery block is configured to generate the plurality of phase-shifted clock signals using the output signals from the receiver that are provided as input signals to the clock and data recovery block.

6. The receiver of claim 5, wherein the clock and data recovery block is a baud-rate clock and data recovery block.

7. The receiver of claim 1, wherein the receiver is a serializer-deserializer receiver.

8. A method for processing an analog input signal at a receiver, the method comprising:
generating a plurality of phase-shifted clock signals;
sampling the analog input signal utilizing a plurality of track-and-hold circuits time-interleaved based on the plurality of phase-shifted clock signals to generate a plurality of output signals, wherein the plurality of phase-shifted clock signals are staggered, wherein each one of the plurality of track-and-hold circuits is configured for tracking a value corresponding to one of the plurality of phase-shifted clock signals and holding the value for a number of time units determined at least partially based on an interleaving factor of the plurality of time-interleaved track-and-hold circuits, and wherein the interleaving factor is the number of circuits of the plurality of time-interleaved track-and-hold circuits; and
generating an additional output signal utilizing an additional track-and-hold circuit, wherein the additional track-and-hold circuit contains a summer on an output of the additional track-and-hold circuit, and wherein the plurality of output signals and the additional output signal are provided as input signals to a clock and data recovery block.

9. The method of claim 8, further comprising:
conditioning the analog input signal prior to sampling the analog input signal utilizing the plurality of track-and-hold circuits.

10. The method of claim 9, further comprising:
equalizing the value provided by the track-and-hold circuit corresponding to each one of the plurality of phase-shifted clock signals utilizing a decision feedback equalizer.

11. The method of claim 9, further comprising:
equalizing the value provided by the track-and-hold circuit corresponding to each one of the plurality of phase-shifted clock signals utilizing a decision feed forward equalizer.

12. The method of claim 8, wherein the clock and data recovery block is configured to generate the plurality of phase-shifted clock signals using the output signals from the receiver that are provided as input signals to the clock and data recovery block.

13. The method of claim 12, wherein the clock and data recovery block is a baud-rate clock and data recovery block.

14. A method for configuring a receiver for a particular communication channel, the method comprising:
providing a clock generator configured for generating a plurality of phase-shifted clock signals;
providing a plurality of time-interleaved track-and-hold circuits configured for sampling an analog input signal with the plurality of phase-shifted clock signals, wherein each one of the plurality of time-interleaved track-and-hold circuits is configured for tracking and holding a value corresponding to one of the plurality of phase-shifted clock signals;
determining whether a length of the communication channel exceeds at least one of a first predetermined length, a second predetermined length, and a third predetermined length, wherein the third predetermined length is greater than the second predetermined length and the second predetermined length is greater than the first predetermined length;
further providing an analog front-end for conditioning the analog input signal prior to providing the analog input signal to the plurality of time-interleaved track-and-hold circuits when the length of the communication channel exceeds the first predetermined length;
further providing a decision feed forward equalizer for equalizing signals received from the plurality of time-interleaved track-and-hold circuits when the length of the communication channel exceeds the second predetermined length; and
further providing a decision feedback equalizer for equalizing the signals received from the plurality of time-interleaved track-and-hold circuits prior to the decision feed forward equalizer when the length of the communication channel exceeds the third predetermined length.

15. The method of claim 14, further comprising:
determining whether the length of the communication channel exceeds a fourth predetermined length, wherein the fourth predetermined length is greater than the first, the second, and the third predetermined length;
providing a plurality of analog-to-digital converters each configured for converting output of one of the plurality of time-interleaved track-and-hold circuits to a digital signal when the length of the communication channel exceeds the fourth predetermined length; and
providing a digital signal processing engine for processing the digital signals from the plurality of analog-to-digital converters when the length of the communication channel exceeds the fourth predetermined length.

16. The method of claim 14, further comprising:
providing output signals from the receiver as input signals to a clock and data recovery block.

17. The method of claim 16, wherein the clock and data recovery block is configured to generate the plurality of phase-shifted clock signals.

18. The method of claim 17, wherein the clock and data recovery block is a baud-rate clock and data recovery block.

\* \* \* \* \*